United States Patent [19]

Driscoll et al.

[11] Patent Number: 4,812,959

[45] Date of Patent: Mar. 14, 1989

[54] SYNCHRONIZATION CIRCUIT FOR A BLOCKING OSCILLATOR

[75] Inventors: Carleton D. Driscoll; Elie M. Najm, both of Cary; Manfred Waechter, Raleigh, all of N.C.

[73] Assignee: International Business Machines Corp., Armonk, N.Y.

[21] Appl. No.: 52,673

[22] Filed: May 20, 1987

[51] Int. Cl.⁴ .................................................. H02M 3/335
[52] U.S. Cl. ........................................ 363/20; 363/56; 363/97
[58] Field of Search ....................... 363/18, 19, 20, 21, 363/97, 56; 315/411; 358/148, 150

[56] References Cited

U.S. PATENT DOCUMENTS

| 4,073,003 | 2/1978 | Chambers | 363/20 |
|---|---|---|---|
| 4,073,004 | 2/1978 | Chambers et al. | 363/56 X |
| 4,253,117 | 2/1981 | Kadlec | 331/145 X |
| 4,263,615 | 4/1981 | Steinmetz et al. | 358/148 |
| 4,323,961 | 4/1982 | Josephson | 363/56 |
| 4,326,244 | 4/1982 | Josephson | 363/56 |
| 4,327,404 | 4/1982 | Horiguchi | 363/97 X |
| 4,510,563 | 4/1985 | Sato | 363/20 |
| 4,525,674 | 6/1985 | Kammiller | 328/63 |
| 4,682,266 | 7/1987 | Huynn et al. | 363/96 X |

Primary Examiner—Peter S. Wong
Assistant Examiner—Kristine Peckman
Attorney, Agent, or Firm—Joscelyn G. Cockburn

[57] ABSTRACT

A non-interfering power supply includes a free-running blocking oscillator power supply subsystem and a circuit arrangement that synchronizes the blocking oscillator power supply subsystem to operate at the horizontal operating frequency of a display subsystem. Synchronizing signals representative of the horizontal operating frequency of the display subsystem are generated and are used to activate the circuit arrangement that causes the blocking oscillator to change its mode of operation from free-running to a fully reset fixed frequency flyback converter. When activated, a switch in the circuit arrangement extends the off-time of a switching transistor in the blocking oscillator power supply control circuit. As a result, the oscillator is forced to run at an operating frequency lower than its free-running frequency.

8 Claims, 2 Drawing Sheets

SYNCHRONIZATION CIRCUIT FOR A BLOCKING OSCILLATOR

BACKGROUND OF THE INVENTION

1. Field of the Invention

The present invention relates to power supplies in general and, more particularly, to power supplies that are synchronized to an external frequency.

2. Prior Art

The use of power supplies as an energy source for different types of loads is well known in the prior art. Usually, power supplies may be classified based upon the topology and/or the frequency of operation. Among the various types of power supplies the flyback or blocking oscillator type is widely used for lower power applications. This type of power supply is popular because it has a relatively simple topology, it requires a reduced number of components, it provides multiple regulated outputs from a single supply, it has high converter efficiency, etc.

A typical flyback power supply is a switching regulator that stores energy in a magnetic field, usually in a power transformer, and then transfers this stored energy into a load. Usually, a first DC potential or voltage is converted by the power transformer into one or more other DC output voltages. By varying the amount of energy stored and dumped per cycle, the output power can be controlled and regulated. Energy variation is achieved by a high power switching transistor, connector in series with the primary winding of the power transformer. The "On-Time" and "Off-Time" of this transistor control the amount of energy coupled across the power transformer. Thus, if the power transistor is off, current flows in one or more of the secondary windings and energy is delivered to the load prior to initiating another cycle. If the power transistor is "on", current flows through the primary winding of the power transformer and energy is stored in the transformer.

Even though the blocking oscillator power supply topology is attractive, it operates at variable frequencies. There are several applications in which it is desirable to synchronize the operating frequency of the blocking oscillator power supply to an external frequency. Such synchronizing is particularly important if interference is likely to occur between the operating frequency of the power supply and the device (load) which it drives. Computer type loads and CRT (Cathode Ray Tube) displays are usually susceptible to such interferences. With CRT displays, the interference usually affects the picture quality.

One example of prior art attempts to adjust the frequency of a switched power supply is set forth in IBM *Technical Disclosure Bulletin*, Vol. 29, No. 11, April 1987 (page 4948). In the article a pulse width modulator (PWM) controlled switch mode power supply is synchronized to run at half the horizontal scan rate of a CRT display. Even though this approach is a step in the right direction, the power supply is operated as a non-reset flyback switcher. This type of switcher is plagued with operational problems including high energy dissipation noise, etc.

Other types of circuits and techniques for adjusting the operational frequency of a switching power supply are set forth in U.S. Pat. Nos. 4,326,244; 4,323,961; 4,510,563 and 4,525,674.

SUMMARY OF THE INVENTION

It is therefore a general object of the present invention to provide a non-interfering power supply for driving a CRT display.

It is also a main object of the present invention to provide a power supply that operates either in a free running mode or in a synchronized mode as a fully reset flyback converter.

The above objectives are achieved by allowing a power supply to start as a blocking oscillator and free run until a sync signal is applied and forces the power supply to operate as a fully reset fixed frequency flyback converter. In the fixed frequency mode the blocking oscillator control circuit determines the "On-Time" of a main switching transistor. However, the "Off-Time" and "Restart Time" is controlled by a synchronizing circuit arrangement.

The synchronizing circuit arrangement includes a hold-off circuit arrangement, a restart circuit arrangement and a synchronizing pulse generating circuit arrangement. The "hold off" circuit arrangement is connected to the base of the main switching transistor. When activated, the hold off circuit extends the off-time of the switching transistor so that a new cycle does not begin until a sync pulse is received. This causes the power supply to operate in a fully reset fixed frequency mode.

The restart circuit arrangement is also connected to the base of the main switching transistor. The restart circuit provides base current to the main switching transistor to initiate a new cycle. While the hold-off circuit is active, it diverts current away from the base of the main switching transistor and prevents it from turning on. When the sync pulse deactivates the hold-off circuit, the main switching transistor is turned on. It stays on until it is turned off by the blocking oscillator control circuit.

The synchronizing pulse generating circuit arrangement provides the pulse which is used to synchronize the power supply. The horizontal drive stage of a horizontal display system generates a pulse train of sync pulses which are amplified and drive the hold off circuit arrangement and the restart circuit arrangement.

If the pulse train is lost, the power supply reverts to a free running blocking oscillator mode of operation.

The foregoing features and other advantages of this invention will be more fully described in the accompanying drawings.

DETAILED DESCRIPTION OF THE PREFERRED EMBODIMENT

Figure 1:
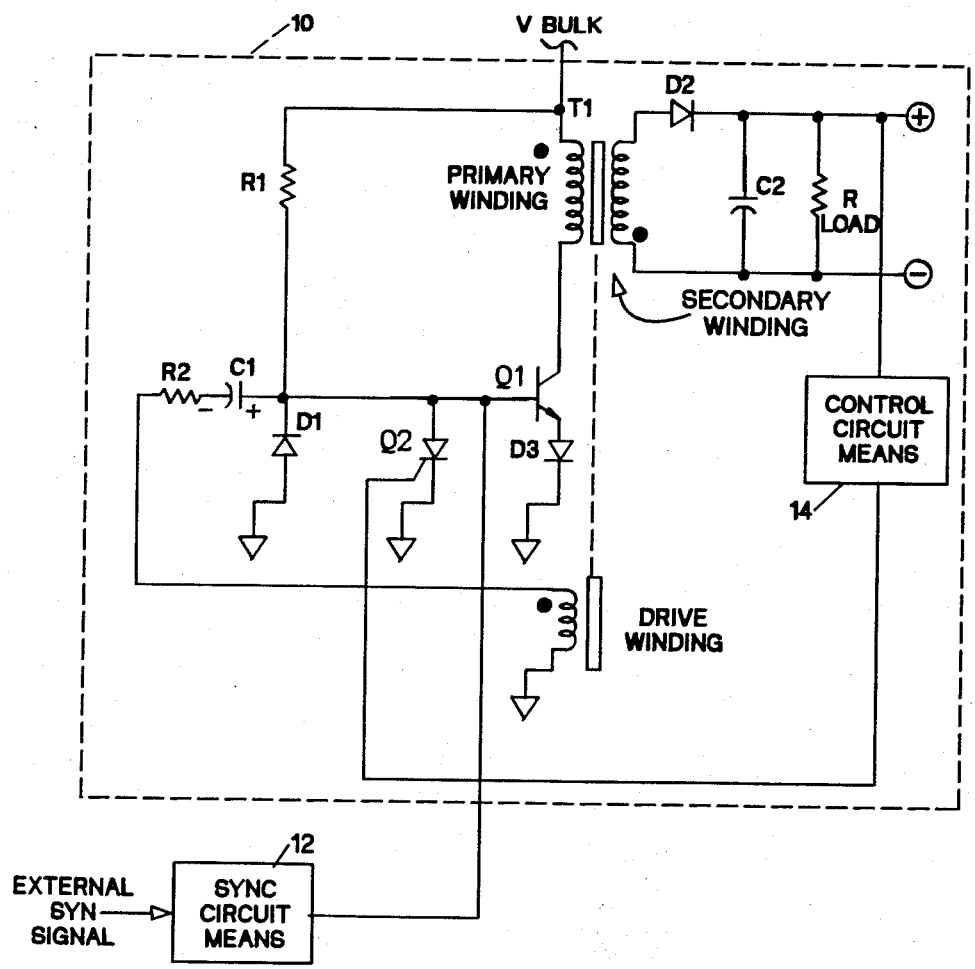
FIG. 1 shows a circuit schematic of a blocking oscillator and the synchronizing circuit arrangement according to the teachings of the present invention.

FIG. 1 shows an improved power supply according to the teachings of the present invention. The improved power supply includes a blocking oscillator 10 and a sync circuit means 12. When the power supply is turned on, blocking oscillator 10 operates in a free running, multi-frequency mode. An external sync signal is received by sync circuit means 12. The sync circuit means forces the blocking oscillator to operate at the frequency of the external sync signal. If the sync signal is discontinued (that is, lost) the blocking oscillator reverts to its free-running mode.

The blocking oscillator 10 includes a power transformer T1 having a primary winding and a secondary winding. The dots on the respective windings indicate the direction of current flow therein. The primary winding has one of its ends connected to a supply voltage (Vbulk) and the other end connected to the collector of main switching transistor Q1. The main switching transistor Q1 controls the energy stored per cycle in the power transformer T1. The emitter of the main switching transistor Q1 is connected through diode D3 to a reference potential. The base of main switching transistor Q1 is connected through SCR Q2 and control circuit means 14 to the secondary side of the power transformer. Control circuit means 14 is a conventional feedback circuit which senses circuit conditions across the load in the secondary side of the power transformer and when certain conditions are met turn on Q2 which pulls the base of Q1 to a reference potential; and, as a result, shuts off the main switching transistor Q1. A drive circuit means including drive winding, resistor R2, and capacitor C1 is also connected to the base of main switching transistor Q1. A resistor R1 connects the base of the main switching transistor to Vbulk. A diode D1 interconnects the base of Q1 to a reference potential. As will be explained subsequently, whereas the control circuit means 14 and SCR Q2 control the ontime of main switching transistor Q1, sync circuit means 12 (details to be given subsequently) controls the off-time of the main switching transistor Q1. In particular, the sync circuit means 12 extends the off-time of main switching transistor Q1 and restarts the main switching transistor when certain conditions are satisfied. Once started, the on period of the transistor is again controlled by the control circuit means 14 and SCR Q2.

In operation, Vbulk is an unregulated DC voltage obtained by rectifying and filtering the AC power line (not shown). Such rectifying and filtering circuits are well known in the prior art and are not shown in the figure. The DC voltage usually ranges from 100 V to 400 V. Blocking oscillator circuit 10 is started by resistor R1 which provides current from Vbulk to charge capacitor C1. When the voltage in C1 reaches the base emitter threshold of Q1, current begins to flow in the base of Q1 and this device is turned on. When this occurs, the bulk voltage appears on the primary winding of T1. By transformer action a voltage appears on the drive winding and its polarity is such that it reinforces the current already flowing in the base of Q1.

A voltage also appears on the secondary winding, but its polarity is such that no secondary current can flow. The current from the drive winding is set by resistor R2. This current is many times larger than the start-up current from R1 and intends to charge C1 in the opposite direction. After the first cycle, R1 has no further effect since C1 is being charged through R2. After a few cycles, the voltage across C1 reaches equilibrium with the polarity shown.

Since Q1 is on, energy is being stored in transformer T1. When the control circuit means 14 decides that sufficient energy has been stored, it turns on SCR Q2. This causes Q1 to turn off. Since the primary winding of T1 acts as an inductor, it generates a voltage of the opposite polarity to try to continue the current flow. By transformer action the drive winding voltage will always change polarity. This causes current to flow in diode D1 which reverse biases the base of Q1 and turns Q2 off. It also recharges C1 in the original direction. The second rectifier D2 now becomes forward biased, and the energy that was stored in T1 is transferred to the load R. Although any load can be attached to the output terminal of the power transformer, in the preferred embodiment of this invention R is a CRT display sub-system having a horizontal sweep frequency to which the blocking oscillator power supply is synchronized by sync circuit means 12. This condition continues until all the energy in T1 has been transferred. Then a new cycle begins. The operating frequency is a function of both bulk voltage and load current. Maximum operating frequency occurs at high bulk and minimum load. Likewise, minimum operating frequency occurs at low bulk and maximum load.

Figure 2:
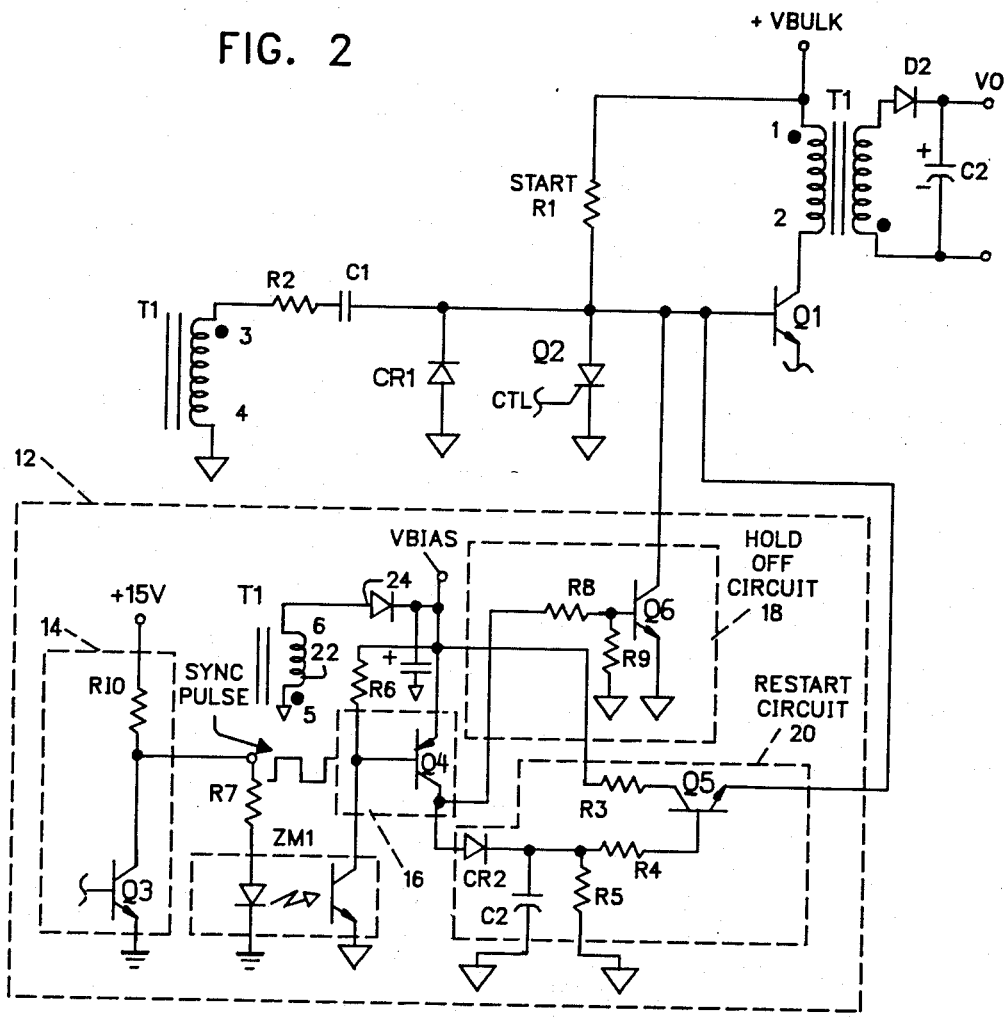
FIG. 2 shows a circuit schematic of an improved power supply with details of the synchronizing circuit arrangement.

Referring now to FIG. 2, a detailed schematic of sync circuit means 12 together with a partial schematic of the blocking oscillator power supply is shown. Only those sections of FIG. 1 which are necessary to understand the overall operation of the improved power supply are shown in FIG. 2. Also, common elements in FIGS. 1 and 2 are identified by common alphanumeric characters.

Still referring to FIG. 2, the sync circuit means 12 includes sync pulse generating circuit arrangement 14, signal coupling means ZM1, amplifier means 16, hold-off circuit arrangement 18 and restart circuit arrangement 20. As will be explained subsequently, sync pulse generating circuit arrangement 14 generates a train of synchronizing pulses. The pulses are generated on the secondary side of the power transformer and are coupled to the primary side by signal-coupling means ZM1 to amplifier means 16. The signal outputted from amplifier means 16 drives hold-off circuit 18 and restart circuit 20. The hold-off circuit 18 creates a "dead time" which inhibits the main switching transistor Q1 from coming back on following turn-off by Q2 and related control circuit means 14 (FIG. 1). Once the "dead time" or hold-off period is completed, restart circuit arrangement 20 restarts (that is, turns on) Q1 and its turn-off is now controlled by Q2 and the related control circuit means 14.

Still referring to FIG. 2, the restart circuit arrangement 20 is connected between the base of main switching transistor Q1 and the collector of amplifier Q4. The restart circuit arrangement 20 includes a switching device Q5 having its emitter electrode connected to the base of main switching transistor Q1, its base electrode coupled through R4 and CR2 to the collector of Q4. Capacitor C2 and resistor R5 interconnect the base electrode of device Q5 to ground potential. The collector electrode of Q5 is connected to the base of device Q4 by resistors R6 and R3.

Hold-off circuit 18 includes a switching device Q6 whose emitter is connected to a reference potential and its collector electrode is connected to the base of main switching transistor Q1. The base of switching device Q6 is coupled to a reference potential by R9 and is coupled through R8 to the collector of device Q4. Device Q4 amplifies the sync pulses which are supplied from signal coupling means ZM1. In the preferred embodiment of this invention ZM1 is an off-the-shelf optical coupler module including a light emitting diode and light sensitive transistor. The collector electrode of the light sensitive transistor is connected to the base of Q4. Vbias, which is a fixed voltage, is presented on the emitter of Q4 by bias winding 22, diode 24 and capacitor 26. It should be noted that bias winding 22 is on the primary side of transformer T1. Also, the numerals and dots on the respective windings show the polarity. Thus, in winding 22 current flows from 5 to 6 and so forth.

The sync pulse generating circuit arrangement 14 includes resistor R10 and device Q3. Although any circuit can be used to obtain the pulse to which the blocking oscillator is synchronized, in the preferred embodiment of this invention the blocking oscillator power supply is synchronized to the horizontal frequency of a CRT display. Thus, resistor R10 and transistor Q3 represent the horizontal drive stage of the display.

OPERATION

At initial power-on, the sync signal is not present. The power supply starts as a blocking oscillator and operates as described above. The control circuit 14 (FIG. 1) turns on SCR Q2 to terminate the on-time of main switching transistor Q1.

After the output voltages have come up, the sync pulses would have appeared. As stated above, the sync pulses are taken from the drive stage of the horizontal output transistor Q3 in a CRT display. Q3 is driven at the horizontal frequency of the display. When Q3 turns off, current flows through R10 and R7 to the diode in the optical coupler (ZM1). The optical coupler provides isolation between the primary and secondary side of the transformer. Even though the sync pulses are generated from secondary voltages, the sync circuit controls the switching transistor on the primary side of power transformer T1. Current flowing in the photodiode causes the phototransistor (ZM1) to conduct. When this device conducts, current flows from emitter to base in Q4, turning the device on. Q4 remains on as long as Q3 is on. The collector current of Q4 drives both the hold-off circuit and the restart circuit. The hold-off circuit (R8, R9 and Q6) resets SCR Q2 and holds Q1 off, thus preventing a new cycle from starting.

The purpose of the restart circuit is to detect the presence of sync pulses and to provide current to the base of Q1 to start a new cycle. It also provides holding current to SCR Q2. In operation, the collector current from Q4 flows through CR2 to charge C2. When C2 has charged to a sufficient high voltage, Q5 turns on. Current from R3 will now flow through Q5 to Q6, Q2 or to the base of Q1 when Q6 and Q2 are off. Once C2 has charged, Q5 will remain on continuously as long as sync pulses are present. If sync is lost, Q6 and Q5 will both turn off and the power supply will revert to the free running blocking oscillator mode.

At the end of the sync pulse, Q3 is turned on. Current flow through ZM1 is stopped, causing Q4 to turn off. Q5 is held on by the charge of C2. CR2 prevents current flow from C2 to the base of Q6, guaranteeing that Q6 will remain off. Base current to Q1 is now provided from Vbias through R3 and Q5. This causes Q1 to turn on and starts a new cycle. Q1 remains on until the control circuit turns Q2 on. Energy then begins to transfer into the secondary loads as in blocking oscillator operation.

While energy is being transferred, Q3 turns off. This causes Q6 to turn on, but this has no effect on Q1 since it was already being held off by Q2. Energy continues to be transferred to the secondary until the power transformer is completely reset. Q6 now prevents a new cycle from starting by sinking the drive current from R3 and holding the base of Q1 at a down level. Q6 remains on until Q3 again changes state and the new cycle begins.

During the off-time of Q1 the voltage on the drive winding (FIG. 1) reverses polarity. This causes the current in R2 to reverse direction. R3 must be chosen such that the current from Vbias through Q5 can supply the reverse current in R2 while at the same time maintaining the required holding current for Q2. This keeps CR1 reverse biased. It also allows Q2 to conduct and hold Q1 off until the next sync pulse turns Q6 on and resets Q2. Then Q1 again receives base current and the cycle repeats.

Several advantages are provided by the above-described circuitry. Among the advantages are:

It allows a blocking oscillator to operate in sync while retaining the basic simple topology.

The power supply operates in full reset flyback mode while in sync. The conventional approach is to operate in a non-reset mode.

The problems associated in operating in a non-reset mode are set forth above.

The power supply automatically reverts to blocking oscillator mode if sync signal is lost.

will work with either resistive or inductive base drive circuits.

can be implemented with low cost components. No high voltage or high current device is needed.

The power transformer does not have to operate below the sync frequency as it does in non-reset operation. As a result a smaller, less expensive transformer is required for the disclosed power supply.

While the invention has been particularly shown and described with reference to the preferred embodiment thereof, it will be understood that various changes of form and details may be made therein without departing from the spirit and scope of the invention.

We claim:

1. In a display system having an improved power subsystem and a display subsystem with said power subsystem comprising:
   (a) a blocking oscillator power supply including a power transformer having primary and secondary winding for providing current to the display subsystem, a first switching transistor connected to one end of the primary winding of said power transformer, and a first control circuit for coupling the secondary winding to the switching transistor with said first control circuit controlling the on period of said switching transistor;
   (b) first circuit means for generating synchronizing pulses representative of a frequency at which said blocking oscillator power supply is being synchronized;
   (c) second circuit means connected to the switching transistor and the first circuit means and operable upon activation by said synchronizing pulses to extend the OFF period of said switching transistor to cause said power supply to operate in a fully reset fixed frequency flyback mode; and
   (d) third circuit means connected to the switching transistor and the first circuit means and operable upon activation by the synchronizing pulses and termination of said OFF period to restart the ON period of said switching transistor.

2. The power subsystem of claim 1 wherein the first circuit means includes:

a switching transistor having emitter electrode, base electrode and collector electrode;
a first resistor connected to the collector electrode;
a second resistor connected to the collector electrode;
an optical coupler connected to said second resistor; and
a circuit arrangement connected to the optical coupler for amplifying signals outputted from the optical coupler.

3. The power subsystem of claim 1 wherein the second circuit means includes a second switching transistor having an emitter lead connected to a referenced voltage level, a collector lead connected to the base of the first switching transistor; and
a resistive network for generating a referenced voltage on a base lead of said second switching transistor.

4. The power subsystem of claim 3 wherein the third circuit means includes a third switching transistor having an emitter lead connected to the base of the first switching transistor, a base lead and a collector lead;
a resistor interconnecting the collector lead to an emitter lead of another switching transistor;
a storage means for monitoring the synchronizing pulses and for generating a voltage therefrom; and
a voltage divider means for coupling the voltage on the storage means to the base lead of said third switching transistor.

5. In a display system having a power subsystem and a display subsystem with said power subsystem including a blocking oscillator power supply and said blocking oscillator power supply further including a power transformer for supplying current to the display subsystem and a first switching transistor for controlling current in said transformer an improved circuit arrangement for synchronizing an operating frequency of the power supply to that of a horizontal frequency of the display comprising:
a switch means including the first switching transistor;
a feedback control circuit arrangement connected between a base electrode of said switching transistor and a secondary winding of said transformer; with said control circuit controlling the ON period of said switching transistor;
a first circuit means for generating synchronizing pulses representative of the horizontal frequency of said display;
a second circuit means connected to the first circuit means for amplifying the synchronizing pulses;
a third control circuit means connected to the switching transistor and the second circuit means; said third circuit means responsive to the synchronizing pulses to hold the switching transistor in an off state; and
a fourth circuit means connected to the switching transistor and the second circuit means, said fourth circuit means responsive to the synchronizing pulses to restart the switching transistor.

6. An improved circuit arrangement having a blocking oscillator power supply with an external signal for synchronization comprising:
a main switching transistor for controlling said blocking oscillator so that a desired voltage is provided at an output of said blocking oscillator power supply;
a first circuit means for generating synchronizing pulses representative of the external signal;
a second circuit means connected to the first circuit means for amplifying the synchronizing pulses;
a feedback control circuit means connecting the output of said blocking oscillator power supply to a base electrode of the switching transistor; said feedback control circuit means monitoring the output and turning off the main switching transistor when the desired voltage is sensed
a third control circuit means connected to the second circuit means and the base electrode of the main switching transistor, said third circuit means responsive to the synchronizing pulses to extend the off state of the main switching transistor; and
a fourth control circuit means connected to the second circuit means and the main switching transistor, said fourth circuit means responsive to the synchronizing pulses to restart the main switching transistor following the end of an extended off period.

7. In a display system having a power subsystem and a display subsystem with said power subsystem including a blocking oscillator power supply and said blocking oscillator power supply further including a power transformer for supplying current to the display subsystem, a main switching transistor for controlling current in said transformer and a control circuit for controlling the ON/OFF state of said switching transistor, a method for synchronizing the blocking oscillator power supply with an external signal and to cause said power supply to operate as a fully reset fixed frequency flyback converter comprising the steps of:
(a) activating the power supply to operate in a free-running mode using the control circuit to activate the ON/OFF state of the switching transistor until the power supply operates in a free-running mode with a free-running frequency that is higher than a frequency at which the power supply is to be synchronized;
(b) generating a pulse train representative of a desired sync frequency;
(c) monitoring the pulse train and on detecting each pulse forcing the switching transistor to remain in a current OFF state for a predetermined time interval;
(d) restarting the switching transistor to an ON state when the predetermined time interval ends; and
(e) using the control circuit to terminate the ON state initiated by step (d), thus causing said blocking oscillator power supply to be synchronized with the pulse train and operate as a fully reset fixed frequency flyback converter.

8. A circuit arrangement having a blocking oscillator power supply which is synchronized to operate at a frequency lower than a free-running frequency of said power supply comprising:
a main switching transistor;
a feedback control circuit means interconnecting an output node of said power supply to an input node of said main switching transistor, said feedback control circuit setting the ON/OFF period of said switching transistor if the blocking oscillator is operating at the free running frequency and setting the ON period of said switching transistor if the blocking oscillator is operating at the lower frequency;

a first circuit generating means for generating a synchronizing signal having a frequency lower than that of the free-running frequency of said blocking oscillator;

a second circuit generating means connected to the main switching transistor and the first circuit means said second circuit generating means adjusting the OFF period of said switching transistor so that the power supply is being synchronized to operate at the lower frequency for a predetermined time interval; and a third circuit generating means connected to the switching transistor and the first circuit means, said third circuit means restarting the switching transistor when the predetermined time period ends.

* * * * *